United States Patent [19]
Jang et al.

[11] Patent Number: 6,007,733
[45] Date of Patent: Dec. 28, 1999

[54] HARD MASKING METHOD FOR FORMING OXYGEN CONTAINING PLASMA ETCHABLE LAYER

[75] Inventors: Syun-Ming Jang; Ming-Hsin Huang, both of Hsin-Chu, Taiwan

[73] Assignee: Taiwan Semiconductor Manufacturing Company, Hsin-Chu, Taiwan

[21] Appl. No.: 09/086,773

[22] Filed: May 29, 1998

[51] Int. Cl.⁶ .................................................... B44C 1/22
[52] U.S. Cl. ............................ 216/80; 216/81; 438/705; 438/723; 438/725
[58] Field of Search ...................... 216/80, 81; 438/723, 438/725, 705

[56] References Cited

U.S. PATENT DOCUMENTS

| | | | |
|---|---|---|---|
| 5,246,883 | 9/1993 | Lin et al. | 437/195 |
| 5,460,693 | 10/1995 | Moslehi | 156/662.1 |
| 5,529,953 | 6/1996 | Shoda | 437/189 |
| 5,565,384 | 10/1996 | Havemann | 437/228 |
| 5,654,240 | 8/1997 | Lee et al. | 438/647 |
| 5,677,243 | 10/1997 | Ohsaki | 437/195 |
| 5,872,061 | 2/1999 | Lee et al. | 438/705 |
| 5,888,309 | 3/1999 | Yu | 134/1.2 |
| 5,922,622 | 7/1999 | Lee et al. | 438/734 |

OTHER PUBLICATIONS

"ULSI Technology", C.Y. Chang et al, McGraw–Hill Companies, Inc, 1996, pp. 446–447.

Korczynski, "Low–k Dielectric Integration Cost Modelling" Solid State Technology, Oct. 1997, pp. 123–128.

Primary Examiner—Edward J. Cain
Attorney, Agent, or Firm—George O. Saile; Stephen B. Ackerman; Alek P. Szecsy

[57] ABSTRACT

A method for forming a patterned layer within a microelectronics fabrication. There is first provided a substrate employed within a microelectronics fabrication. There is then formed over the substrate an oxygen containing plasma etchable layer, where the oxygen containing plasma etchable layer is formed of a material which is also susceptible to etching within a fluorine containing plasma. There is then formed upon the oxygen containing plasma etchable layer a hard mask layer. There is then formed upon the hard mask layer a patterned photoresist layer. There is then etched through use of a first anisotropic plasma etch method the hard mask layer to form a patterned hard mask layer while simultaneously reaching the oxygen containing plasma etchable layer and while employing the patterned photoresist layer as a first etch mask layer. The first anisotropic plasma etch method employs an etchant gas composition appropriate for etching the hard mask material. There is then stripped from the patterned hard mask layer the patterned photoresist layer, where the patterned photoresist layer is stripped employing a stripping method which does not attack the oxygen containing plasma etchable layer. Finally, there is then etched through use of a second plasma etch method the oxygen containing plasma etchable layer to form a patterned oxygen containing plasma etchable layer while employing the patterned hard mask layer as a second etch mask layer, where the second plasma etch method is the fluorine containing plasma etch method. The method is particularly useful for forming patterned low dielectric constant dielectric layers within microelectronics fabrications.

16 Claims, 3 Drawing Sheets

HARD MASKING METHOD FOR FORMING OXYGEN CONTAINING PLASMA ETCHABLE LAYER

BACKGROUND OF THE INVENTION

1. Field of the Invention

The present invention relates generally to oxygen containing plasma etchable layers within microelectronics fabrications. More particularly, the present invention relates to methods for forming patterned oxygen containing plasma etchable layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and conductor element dimensions have decreased, it has become increasingly common within the art of microelectronics fabrication to employ interposed between the patterns of narrow linewidth dimension and/or narrow pitch dimension patterned microelectronics conductor layers within microelectronics fabrications microelectronics dielectric layers formed of low dielectric constant dielectric materials. For the purposes of this disclosure, low dielectric constant dielectric materials are intended as dielectric materials having a dielectric constant of less than about 3.6, while higher dielectric constant dielectric layers formed within microelectronics fabrications employing conventional silicon oxide, silicon nitride and silicon oxynitride dielectric materials typically have dielectric constants in the range of from about 4.0 to about 7.0. Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers through which there may be fabricated microelectronics fabrications with enhanced microelectronics fabrication speed, attenuated patterned microelectronics conductor layer parasitic capacitance and attenuated patterned microelectronics conductor layer cross-talk.

Low dielectric constant dielectric materials which may be employed for forming low dielectric constant microelectronics dielectric layers within microelectronics fabrications are typically materials with elevated hydrogen and/or carbon content, such as but not limited to organic polymer spin-on-polymer dielectric materials (such as but not limited to polyimide organic polymer spin-on-polymer dielectric materials, poly (arylene ether) organic polymer spin-on-polymer dielectric materials, and fluorinated poly (arylene ether) organic polymer spin-on-polymer dielectric materials), amorphous carbon dielectric materials (such as but not limited to amorphous carbon and fluorinated amorphous carbon) and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin-on-glass (SOG) dielectric materials).

Silsesquioxane spin-on-glass (SOG) dielectric materials are characterized by the general chemical formula R1—Si(OR2)3, where: (1) R1 may be any of several radicals, including but not limited to hydrogen radical (—H) and carbon bonded organic radicals such as but not limited to carbon bonded hydrocarbon radicals (such as but not limited to methyl radical —CH3) and ethyl radical (—C2H5)) and carbon bonded fluorocarbon radicals (such as but not limited to trifluoromethyl radical (—CF3) and pentafluoroethyl radical (—C2F5)), but not oxygen bonded radicals; and (2) R2 is typically, although not exclusively, a carbon bonded organic radical such as but not limited to a methyl radical (—CH3) or an ethyl radical (—C2H5). Such silsesquioxane spin-on-glass dielectric materials are typically spin-coated and subsequently thermally cured at temperatures of from about 350 to about 420 degrees centigrade to form within microelectronics fabrications low dielectric constant microelectronics dielectric layers.

While organic polymer spin-on-polymer dielectric materials, amorphous carbon dielectric materials, and silsesquioxane spin-on-glass (SOG) dielectric materials are thus desirable within the art of microelectronics fabrication for forming low dielectric constant microelectronics dielectric layers within microelectronics fabrications, organic polymer spin-on-polymer dielectric materials, amorphous carbon dielectric materials, and silsesquioxane spin-on-glass (SOG) dielectric materials are not entirely without problems in forming low dielectric constant microelectronics dielectric layers within microelectronics fabrications. In particular, organic polymer spin-on polymer dielectric materials, amorphous carbon dielectric materials, and silsesquioxane spin-on-glass (SOG) dielectric materials, due to their hydrogen content and/or carbon content, are difficult to pattern with uniform linewidth dimension within advanced microelectronics fabrications through conventional photolithographic methods employing conventional positive or negative photoresist etch mask layers, since when stripping while employing a conventional oxygen containing plasma etch method from such a patterned low dielectric constant microelectronics dielectric layer a conventional positive or negative photoresist etch mask layer which is employed in defining the patterned low dielectric constant microelectronics dielectric layer, there is typically laterally etched the patterned low dielectric constant microelectronics dielectric layer due to susceptibility to etching of the low dielectric constant dielectric material within the oxygen containing plasma etch method.

Laterally etched patterned low dielectric constant microelectronics dielectric layers are undesirable within advanced microelectronics fabrications since when such laterally etched patterned low dielectric constant microelectronics dielectric layers have contact vias or interconnection vias formed therethrough to access semiconductor substrate contact regions or patterned conductor layer contact regions within microelectronics fabrications there is often compromised the linewidth and/or spacing of patterned microelectronics conductor stud layers formed within the contact vias or interconnection vias formed through those laterally etched patterned low dielectric constant microelectronics dielectric layers.

It is thus towards the goal of forming within advanced microelectronics fabrications patterned low dielectric constant microelectronics dielectric layers formed from oxygen containing plasma etchable dielectric materials, with attenuated lateral etching of the patterned low dielectric constant microelectronics dielectric layers when stripping from the patterned low dielectric constant microelectronics dielectric layers patterned photoresist layers employed in defining those patterned low dielectric constant microelectronics dielectric layers that the present invention is more specifically directed. In a more general sense, the present invention is also directed towards forming within advanced microelectronics fabrications patterned microelectronics layers (not necessarily patterned microelectronics dielectric layers) formed of oxygen containing plasma etchable materials with attenuated lateral etching of the patterned microelectronics layers when stripping from the patterned microelectronics layers patterned photoresist layers which are employed in defining those patterned microelectronics layers.

Various photolithographic and etch methods have been disclosed in the art of microelectronics fabrication for forming patterned microelectronics layers within microelectronics fabrications.

For example, Liu in ULSI Technology, C. Y. Chang et al., eds., McGraw-Hill (1996), pp. 446–47, discloses in general various methods for forming within integrated circuit microelectronics fabrications bordered and borderless stacked patterned conductor contact layers. Disclosed are both damascene and non-damascene methods for forming the bordered and borderless stacked patterned conductor contact layers.

Similarly, Korczynski, in "Low-k dielectric integration cost modelling," Solid State Technology, October 1997, pp. 123–28, discloses in general various methods for forming patterned low dielectric constant dielectric layers interposed between the patterns of patterned conductor interconnection layers within microelectronics fabrications. Disclosed are standard patterned conductor metal interconnection formation and isolation methods and dual damascene patterned conductor metal interconnection formation and isolation methods.

In addition, Lin et al., in U.S. Pat. No. 5,246,883, discloses a method for forming a contact via structure through at least one dielectric layer within an integrated circuit microelectronics fabrication. The method employs at least the one dielectric layer having formed thereover a first buffer layer which in turn has formed thereupon a second buffer layer, where the second buffer layer has a higher isotropic etch rate in an isotropic etch method than the first buffer layer. By employing the isotropic etch method for etching the second buffer layer and at least a portion of the first buffer layer, followed by an anisotropic etch method for etching any remainder of the first buffer layer and at least the one dielectric layer, the taper of the sidewall of a via formed through at least the second buffer layer, the first buffer layer and the dielectric layer may be controlled.

Further, Moslehi, in U.S. Pat. No. 5,460,693, discloses a photolithography method for use in fabricating patterned integrated circuit microelectronics layers within integrated circuit microelectronics fabrications, where the photolithography method is undertaken employing dry processing methods only. The completely dry processing photolithography method employs a halogen doped silicon layer or a halogen doped silicon-germanium layer as a photosensitive layer from which is subsequently grown an oxide hard mask layer employed as an etch mask layer when etching a processable integrated circuit microelectronics layer formed below the halogen doped silicon layer or the halogen doped silicon-germanium layer.

Yet further, Havemann, in U.S. Pat. No. 5,565,384, discloses a method for forming within an integrated circuit microelectronics fabrication a self-aligned via through an inorganic dielectric layer to access a patterned conductor layer formed below the inorganic dielectric layer, where the patterned conductor layer has interposed at least partially between its patterns an organic containing dielectric layer. The patterned conductor layer and the organic dielectric layer are completely covered by the inorganic dielectric layer. The method employs an anisotropic etchant which is selective to the inorganic dielectric layer with respect to the organic dielectric layer, such that the organic dielectric layer serves as an etch stop layer when etching the self-aligned via through the inorganic dielectric layer, thus avoiding overetching of the organic dielectric layer.

Still yet further, Shoda, in U.S. Pat. No. 5,529,953, discloses a method for forming within an integrated circuit microelectronics fabrication a void free patterned contiguous interconnection and contact stud layer within a dielectric layer having formed therein an interconnection trench contiguous with but at a different level than a contact via. The method employs forming upon the floor of the interconnection trench a first material which exhibits a first incubation time for forming the patterned contiguous interconnection and contact stud layer thereupon. The method also employs forming upon the floor of the contact via a second material which exhibits a second incubation time for forming the patterned contiguous interconnection and contact stud layer thereupon, where the first incubation time is greater than the second incubation time.

Moreover, Ohsaki, in U.S. Pat. No. 5,677,243, discloses a method for forming an interconnection stud layer within an interconnection via within a dielectric layer within an integrated circuit, where the interconnection via is conventionally formed employing a single etch method while employing a pair of patterned photoresist etch mask layers sequentially overlying the dielectric layer. The method employs a sacrificial organic interconnection via filling layer filled within the interconnection via subsequent to a first etch method within a pair of etch methods, such that the pair of etch methods may be undertaken with separate patterned photoresist layers and thus provide the interconnection stud layer and interconnection via of maximum width.

Finally, Lee et al., in U.S. Pat. No. 5,654,240, discloses a method for forming a patterned conductor contact layer contacting a semiconductor substrate within an integrated circuit microelectronics fabrication, while avoiding trenching within the semiconductor substrate when etching the patterned conductor contact layer from a corresponding blanket conductor contact layer formed contacting the semiconductor substrate. The method employs: (1) a first patterned conductor layer formed upon a patterned dielectric layer formed upon the semiconductor substrate, where the first patterned conductor layer does not contact the semiconductor substrate; and (2) a second patterned conductor layer patterned to terminate upon the first patterned conductor layer while contacting the first patterned conductor layer and the semiconductor substrate.

Desirable within the art of microelectronics fabrication are methods and materials through which there may be formed within microelectronics fabrications patterned microelectronics layers formed of oxygen containing plasma etchable materials, with attenuated lateral etching of the patterned microelectronics layers when stripping from the patterned microelectronics layers patterned photoresist layers employed in defining the patterned microelectronics layers. More particularly desirable within the art of microelectronics fabrication are methods and materials through which there may be formed within microelectronics fabrications patterned low dielectric constant microelectronics dielectric layers formed of oxygen containing plasma etchable low dielectric constant dielectric materials, with attenuated lateral etching of the patterned low dielectric constant microelectronics dielectric layers when stripping from the patterned low dielectric constant microelectronics dielectric layers patterned photoresist layers employed in defining those patterned low dielectric constant microelectronics dielectric layers.

It is towards the foregoing objects that the present invention is both generally and more specifically directed.

SUMMARY OF THE INVENTION

A first object of the present invention is to provide a method for forming within a microelectronics fabrication a patterned microelectronics layer formed from an oxygen containing plasma etchable material.

A second object of the present invention is to provide a method in accord with the first object of the present invention, where the patterned microelectronics layer is formed with attenuated lateral etching of the patterned microelectronics layer when stripping from the patterned microelectronics layer a patterned photoresist layer employed in defining the patterned microelectronics layer.

A third object of the present invention is to provide a method in accord with the first object of the present invention or the second object of the present invention, where the oxygen containing plasma etchable material is a low dielectric constant dielectric material.

A fourth object of the present invention is to provide a method in accord with the first object of the present invention, the second object of the present invention, or the third object of the present invention, which method is readily commercially implemented.

In accord with the objects of the present invention, there is provided by the present invention a method for forming a patterned layer within a microelectronics fabrication. To practice the method of the present invention, there is first provided a substrate employed within a microelectronics fabrication. There is then formed over the substrate an oxygen containing plasma etchable layer, where the oxygen containing plasma etchable layer is formed of a material which is also susceptible to etching within a fluorine containing plasma. There is then formed upon the oxygen containing plasma etchable layer a hard mask layer. There is then formed upon the hard mask layer a patterned photoresist layer. There is then etched through use of a first anisotropic plasma etch method the hard mask layer to form a patterned hard mask layer while simultaneously reaching the oxygen containing plasma etchable layer and while employing the patterned photoresist layer as a first etch mask layer. The first anisotropic plasma etch method employs an etchant gas composition appropriate for etching the hard mask material. There is then stripped from the patterned hard mask layer the patterned photoresist layer, where the patterned photoresist layer is stripped employing a stripping method which does not attack the oxygen containing plasma etchable layer. There is then etched through use of a second plasma etch method the oxygen containing plasma etchable layer to form a patterned oxygen containing plasma etchable layer while employing the patterned hard mask layer as a second etch mask layer, where the second plasma etch method is the fluorine containing plasma etch method.

There is provided by the present invention a method for forming within a microelectronics fabrication a patterned microelectronics layer from an oxygen containing plasma etchable material, where the patterned microelectronics layer is formed with attenuated lateral etching of the patterned microelectronics layer when stripping from the patterned microelectronics layer a patterned photoresist layer employed in defining the patterned microelectronics layer. The method of the present invention realizes the foregoing objects by employing: (1) an oxygen containing plasma etchable material which is also susceptible to etching within a fluorine containing plasma etch method; (2) the fluorine containing plasma etch method for forming the patterned microelectronics layer from a corresponding layer while employing a patterned hard mask layer, and (3) a stripping of a patterned photoresist layer from the patterned hard mask layer employing a method which does not etch the oxygen containing plasma etchable material.

The method of the present invention may be employed where the oxygen containing plasma etchable material is a low dielectric constant dielectric material. The method of the present invention does not discriminate with respect to the nature of the oxygen containing plasma etchable material provided that the oxygen containing plasma etchable material is susceptible to etching within a fluorine containing plasma etch method in additional to an oxygen containing plasma etch method. Thus, the method of the present invention may be employed where the oxygen containing plasma etchable material is a low dielectric constant dielectric material, as well as other oxygen containing plasma etchable materials such as but not limited to oxygen containing plasma etchable conductor materials, oxygen containing plasma etchable semiconductor materials and oxygen containing plasma etchable higher dielectric constant dielectric materials.

The method of the present invention is readily commercially implemented. The method of the present invention employs methods and materials as are otherwise generally known in the art of microelectronics fabrication. Since it is the process control and process sequencing within the method of the present invention which provides, at least in part, novelty to the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

There is provided by the present invention a method for forming within a microelectronics fabrication a patterned microelectronics layer from an oxygen containing plasma etchable material, where the patterned microelectronics layer is formed with attenuated lateral etching of the patterned microelectronics layer when stripping from the patterned microelectronics layer a patterned photoresist layer employed in defining the patterned microelectronics layer. The method of the present invention realizes the foregoing objects by employing: (1) an oxygen containing plasma etchable material which is also susceptible to etching within a fluorine containing plasma etch method; (2) the fluorine containing plasma etch method for forming the patterned microelectronics layer from a corresponding layer while employing a patterned hard mask layer; and (3) a stripping of a patterned photoresist layer from the patterned hard mask layer employing a method which does not etch the oxygen containing plasma etchable material.

Although the method of the present invention is most likely to provide value when forming within a microelectronics fabrication a via through a low dielectric constant microelectronics dielectric layer formed of an oxygen containing plasma etchable low dielectric constant dielectric material, the method of the present invention may be employed in forming patterned microelectronics layers formed of oxygen containing plasma etchable microelectronics materials including but not limited to oxygen containing plasma etchable microelectronics conductor materials, oxygen containing plasma etchable microelectronics semiconductor materials and oxygen containing plasma etchable microelectronics dielectric materials, presuming that the microelectronics materials are also susceptible to etching within a fluorine containing plasma. Microelectronics fabrications within which may be formed patterned microelectronics layers of oxygen containing plasma etchable materials through the method of the present invention include but are not limited to integrated circuit microelectronics fabrications, solar cell microelectronics fabrications, ceramic substrate microelectronics fabrications and flat panel display microelectronics fabrications.

First Preferred Embodiment

Figure 1:
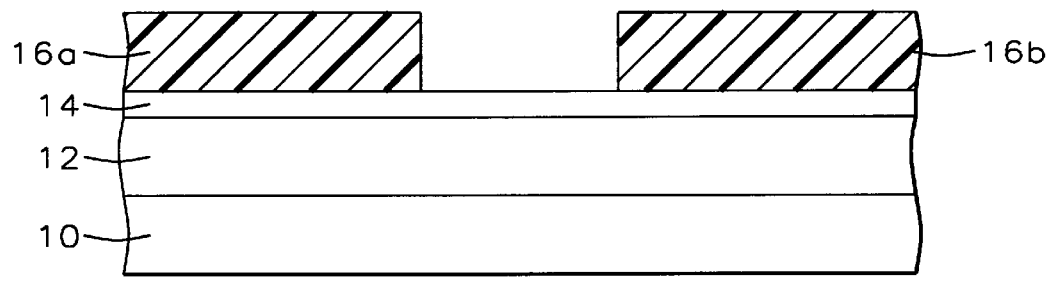
FIG. 1 to FIG. 4 show a series of schematic cross-sectional diagrams illustrating the results of forming within a microelectronics fabrication in accord with a general embodiment of the present invention which comprises a first preferred embodiment of the present invention a patterned oxygen containing plasma etchable microelectronics layer from a blanket oxygen containing plasma etchable microelectronics layer.

Referring now to FIG. 1 to FIG. 4, there is shown a series of schematic cross-sectional diagrams illustrating the results of forming within a microelectronics fabrication in accord with a general embodiment of the present invention which comprises a first preferred embodiment of the present invention a patterned microelectronics layer formed of an oxygen containing plasma etchable material. Shown in FIG. 1 is a schematic cross-sectional diagram of the microelectronics fabrication at an early stage in its fabrication in accord with the method of the present invention.

Shown in FIG. 1 is a substrate 10 employed within a microelectronics fabrication, where the substrate 10 has formed thereover a blanket oxygen containing plasma etchable layer 12. In turn, the blanket oxygen containing plasma etchable layer 12 has formed thereupon a blanket hard mask layer 14. Finally, the blanket hard mask layer 14 has formed thereupon a pair of patterned photoresist layers 16a and 16b.

Within the first preferred embodiment of the present invention, the substrate 10 is a substrate which may be employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications. Similarly, although not specifically illustrated within the schematic cross-sectional diagram of FIG. 1, the substrate 10 may be the substrate alone employed within the microelectronics fabrication, or in the alternative, the substrate 10 may be the substrate employed within the microelectronics fabrication, where the substrate 10 is intended to include the substrate alone employed within the microelectronics fabrication, along with additional microelectronics layers formed interposed between the substrate 10 and the blanket oxygen containing plasma etchable layer 12. Such additional microelectronics layers may include, but are not limited to, microelectronics conductor layers, microelectronics semiconductor layers and microelectronics dielectric layers as are conventionally employed within a microelectronics fabrication within which is employed the substrate 10.

Additionally, although also not specifically illustrated within the schematic cross-sectional diagram of FIG. 1, the substrate 10, particularly when the substrate 10 is a semiconductor substrate employed within a semiconductor integrated circuit microelectronics fabrication as is more preferred within the first preferred embodiment of the present invention, typically and preferably has formed therein and/or thereupon integrated circuit devices such as but not limited to transistors, resistors, capacitors and diodes.

Within the first preferred embodiment of the present invention with respect to the blanket oxygen containing plasma etchable layer 12, the blanket oxygen containing plasma etchable layer 12 may be formed from any oxygen containing plasma etchable material as is conventional in the art of microelectronics fabrication given the proviso that the oxygen containing plasma etchable material is also etchable within a fluorine containing plasma employed within a fluorine containing plasma etch method. Such oxygen containing plasma etchable materials may include, but are not limited to, oxygen containing plasma etchable conductor materials, oxygen containing plasma etchable semiconductor (or semidielectric) materials and oxygen containing plasma etchable dielectric materials. Oxygen containing plasma etchable conductor materials may include, but are not limited to, graphite materials, while oxygen containing plasma etchable semiconductor (or semidielectric) materials may include, but are not limited to, appropriate oxygen containing plasma etchable dielectric materials having included therein graphite materials. Preferably, the blanket oxygen containing plasma etchable layer 12 is formed to a thickness of from about 6000 to about 13000 angstroms over the substrate 10.

Within the first preferred embodiment of the present invention with respect to the blanket hard mask layer 14, the blanket hard mask layer 14 is may be formed of any hard mask material which effectively serves as a hard mask when etching the blanket oxygen containing plasma etchable layer 12. Such hard mask materials may include, but are not limited to metals, metal alloys, metal oxides, metal nitrides and composites thereof Typically and preferably, the blanket hard mask layer 14 is formed from a hard mask material selected from the group of hard mask materials including but not limited to metal oxide hard mask materials and metal nitride hard mask materials. Preferably, the blanket hard mask layer 14 is formed to a thickness of from about 500 to about 2000 angstroms upon the blanket oxygen containing plasma etchable layer 12.

Finally, within the first preferred embodiment of the present invention with respect to the patterned photoresist layers 16a and 16b, the patterned photoresist layers 16a and 16b may be formed from any of several photoresist materials as are conventional in the art of microelectronics fabrication, such photoresist materials being selected from the general groups of photoresist materials including but not limited to positive photoresist materials and negative photoresist materials. Preferably, the patterned photoresist layers 16a and 16b so formed are each formed to a thickness of from about 7000 to about 15000 angstroms.

Figure 2:
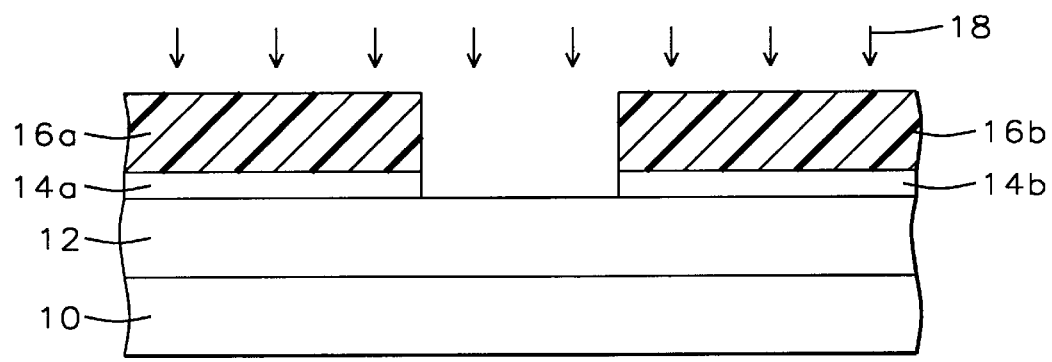

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 14 has been patterned to form the patterned hard mask layers 14a and 14b through etching with a first etching plasma 18 while employing the patterned photoresist layers 16a and 16b as a first etch mask layer. Within the first preferred embodiment of the present invention, the first etching plasma 18 is an anisotropic etching plasma which employs an etchant gas composition appropriate to the material from which is formed the blanket hard mask layer 14.

Figure 3:
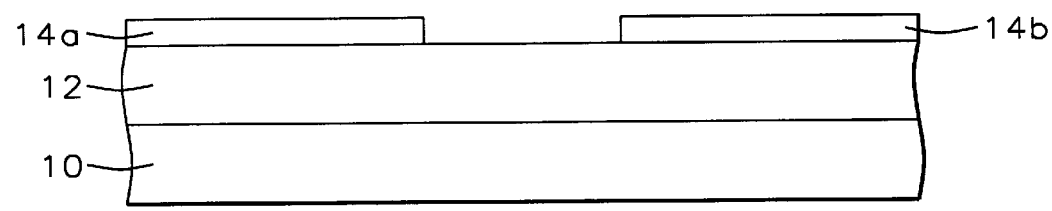

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the patterned photoresist layers 16a and 16b have been stripped from the corresponding patterned hard mask layers 14a and 14b. Within the first preferred embodiment of the present invention, the patterned photoresist layers 16a and 16b are stripped from the corresponding patterned hard mask layers 14a and 14b employing a method which does not etch the exposed portion of the blanket oxygen containing plasma etchable layer 12. Within the first preferred embodiment of the present invention such a method will typically, but not exclusively, be a wet chemical stripping method employing an organic stripper solvent or an aqueous stripper solution appropriate to the photoresist material from which is formed the patterned photoresist layers 16a and 16b.

Figure 4:
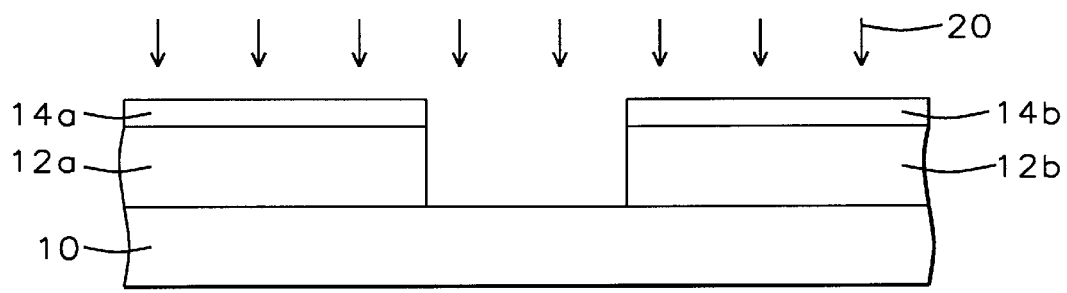

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein there is formed from the blanket oxygen containing plasma etchable layer 12 the patterned oxygen containing plasma etchable layers 12a and 12b through etching within a second etching plasma 20 while employing the patterned hard mask layers 14a and 14b as a second etch mask layer. The second etching plasma 20 is a fluorine containing etching plasma employing a fluorine containing etchant gas composition employed within a fluorine containing plasma etch method.

Within the first preferred embodiment of the present invention, the fluorine containing etchant gas composition may employ a fluorine containing etchant gas selected from the group of fluorine containing etchant gases including but not limited to perfluorocarbons, hydrofluorocarbons, sulfur hexafluoride and nitrogen trifluoride.

In addition, within the first preferred embodiment of the present invention it is also desirable to employ within the fluorine containing plasma etch method which employs the second etching plasma 20 a sputtering gas component within the fluorine containing etchant gas composition. The presence of the sputtering gas component attenuates lateral etching of the patterned oxygen containing plasma etchable layers 12a and 12b when forming the patterned oxygen containing plasma etchable layers 12a and 12b. Typical sputtering gas components include, but are not limited to argon and xenon, with argon being particularly preferred. Typically and preferably, the sputtering gas component is present at a volume percentage of from about 10 to about 40 percent of the etchant gas composition employed within the second etching plasma 20.

Upon forming the microelectronics fabrication whose schematic cross-sectional diagram is illustrated in FIG. 3, there is formed a microelectronics fabrication having formed therein a pair of patterned oxygen containing plasma etchable layers with attenuated lateral etching of the pair of patterned oxygen containing plasma etchable layers when stripping from the microelectronics fabrication a pair of patterned photoresist layers employed in defining the pair of patterned oxygen containing plasma etchable layers.

Second Preferred Embodiment

Figure 5:
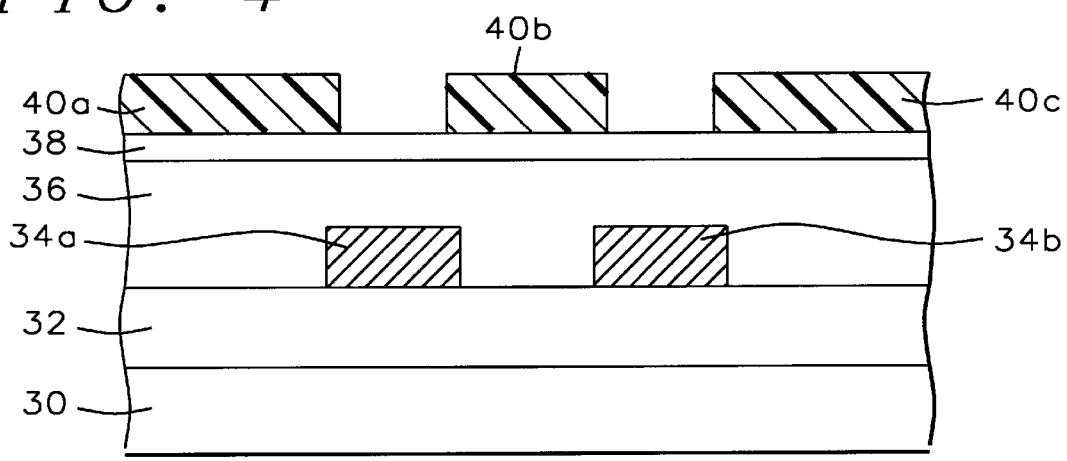
FIG. 5 to FIG. 8 show a series of schematic cross-sectional diagrams illustrating the results of forming within a microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer within the microelectronics fabrication.

Referring now to FIG. 5 to FIG. 8, there is shown a series of schematic cross-sectional diagrams illustrating the results of forming within a microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer within the microelectronics fabrication. Shown in FIG. 5 is a schematic cross-sectional diagram of the microelectronics fabrication at an early stage in practice of the second preferred embodiment of the present invention.

Shown in FIG. 5 is a substrate 30 employed within a microelectronics fabrication, where the substrate 30 has formed thereover a blanket first dielectric layer 32. In turn, the blanket first dielectric layer 32 has formed thereupon a pair of patterned conductor layers 34a and 34b. Similarly, the patterned conductor layers 34a and 34b, and portions of the blanket first dielectric layer 36 adjoining the patterned conductor layers 34a and 34b, have formed thereupon a blanket inter-metal dielectric (IMD) layer 36. The blanket inter-metal dielectric (IMD) layer 36 has formed thereupon a blanket hard mask layer 38. Finally, the blanket bard mask layer 38 has formed thereupon a series of patterned photoresist layers 40a, 40b and 40c.

Within the second preferred embodiment of the present invention, the substrate 30, analogously or equivalently with the substrate 10 employed within the first preferred embodiment of the present invention as illustrated within FIG. 1, may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications.

Within the second preferred embodiment of the present invention with respect to the blanket first dielectric layer 32, the blanket first dielectric layer 32 may be formed from any of several dielectric materials as are conventional in the art of microelectronics fabrication. Such dielectric materials may include, but are not limited to, silicon oxide dielectric materials, silicon nitride dielectric materials, silicon oxynitride dielectric materials and composites thereof. Preferably, the blanket first dielectric layer 32 as illustrated within the schematic cross-sectional diagram of FIG. 5 is formed from a silicon oxide dielectric material deposited employing a plasma enhanced chemical vapor deposition (PECVD) method, as is conventional in the art of microelectronics fabrication. Preferably, the blanket first dielectric layer 32 so formed is formed to a thickness of from about 6000 to about 13000 angstroms over the substrate 30.

Within the second preferred embodiment of the present invention with respect to the patterned conductor layers 34a and 34b, methods and materials through which patterned conductor layers may be formed within microelectronics fabrications are known in the art of microelectronics fabrication. Patterned conductor layers may be formed within microelectronics fabrications through patterning, through methods as are conventional in the art of microelectronics fabrication, of blanket conductor layers formed within microelectronics fabrications. Blanket conductor layers may be formed within microelectronics fabrications employing methods including but not limited to thermally assisted evaporation methods, electron beam assisted evaporations methods, chemical vapor deposition (CVD) methods, and physical vapor deposition (PVD) sputtering methods through which may be formed blanket conductor layers of conductor materials including but not limited to metals, metal alloys, doped polysilicon and polycides (doped polysilicon/metal silicide stacks). For the second preferred embodiment of the present invention, the patterned conductor layers 34a and 34b are preferably formed at least in part of an aluminum containing conductor material, beneath and/or above which is formed an optional barrier material layer, as is common in the art of microelectronics fabrication. Preferably the patterned conductor layers 34a and 34b so formed are each formed to a thickness of from about 4000 to about 7000 angstroms upon the blanket first dielectric layer 32.

Although not specifically illustrated within the schematic cross-sectional diagram of FIG. 5, the patterned conductor layers 34a and 34b are each formed of a linewidth preferably from about 0.25 to about 1.0 microns and each separated by a pitch distance preferably from about 0.25 to about 1.0 microns.

Within the second preferred embodiment of the present invention with respect to the blanket inter-metal dielectric (IMD) layer 36, the blanket inter-metal dielectric (IMD) layer 36 corresponds generally with the blanket oxygen containing plasma etchable layer 12 within the first preferred embodiment of the present invention insofar as the blanket inter-metal dielectric (IMD) layer 36 is also formed of an oxygen containing plasma etchable material which may also be etched employing a fluorine containing plasma etch method. However, within the second preferred embodiment of the present invention, the blanket inter-metal dielectric (IMD) layer 36 is formed from an oxygen containing plasma etchable material which is a low dielectric constant dielectric material which is simultaneously also etchable employing the fluorine containing plasma etch method. Such oxygen containing plasma etchable low dielectric constant dielectric materials include, but are not limited to, organic polymer spin-on-polymer dielectric materials (such as but not limited to polyimide organic polymer spin-on-polymer dielectric materials, poly (arylene ether) organic polymer spin-on-polymer dielectric materials, and fluorinated poly (arylene ether) organic polymer spin-on-polymer dielectric materials), amorphous carbon dielectric materials (such as but not limited to amorphous carbon and fluorinated amorphous carbon), and silsesquioxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials).

Within the second preferred embodiment of the present invention, the blanket inter-metal dielectric (IMD) layer 36 is preferably formed to a thickness of from about 6000 to about 13000 angstroms employing a fluorinated poly (arylene ether) organic polymer spin-on-polymer dielectric material or a poly (arylene ether) organic polymer spin-on-polymer dielectric material. Such fluorinated poly (arylene ether) organic polymer spin-on-polymer dielectric materials and poly (arylene ether) organic polymer spin-on-polymer dielectric materials are known in the art and are commercially available, for example, from Allied-Signal Corporation as FLARE™ 2.0 dielectric materials and from Schumacher, Inc. as PAE-2.0 and PAE-2.3 dielectric materials.

Within the second preferred embodiment of the present invention with respect to the blanket hard mask layer 38, although the blanket hard mask layer 38 may generally be formed employing methods and materials analogous or equivalent to the methods and materials employed in forming the blanket hard mask layer 14 employed within the first preferred embodiment of the present invention as illustrated in FIG. 1, within the second preferred embodiment of the present invention, the blanket hard mask layer 38 is preferably formed of a titanium nitride hard mask material deposited employing a chemical vapor deposition (CVD) method. Preferably, the blanket hard mask layer 38 of titanium nitride so formed is formed to a thickness of from about 500 to about 2000 angstroms upon the blanket inter-metal dielectric (IMD) layer 36.

Finally, within the second preferred embodiment of the present invention with respect to the series of patterned photoresist layers 40a, 40b and 40c, the series of patterned photoresist layers 40a, 40b and 40c is preferably formed employing methods, materials, and dimensions analogous or equivalent to the methods, materials and dimensions employed in forming the patterned photoresist layers 16a and 16b within the first preferred embodiment of the present invention as illustrated within the schematic cross-sectional diagram of FIG. 1.

Figure 6:
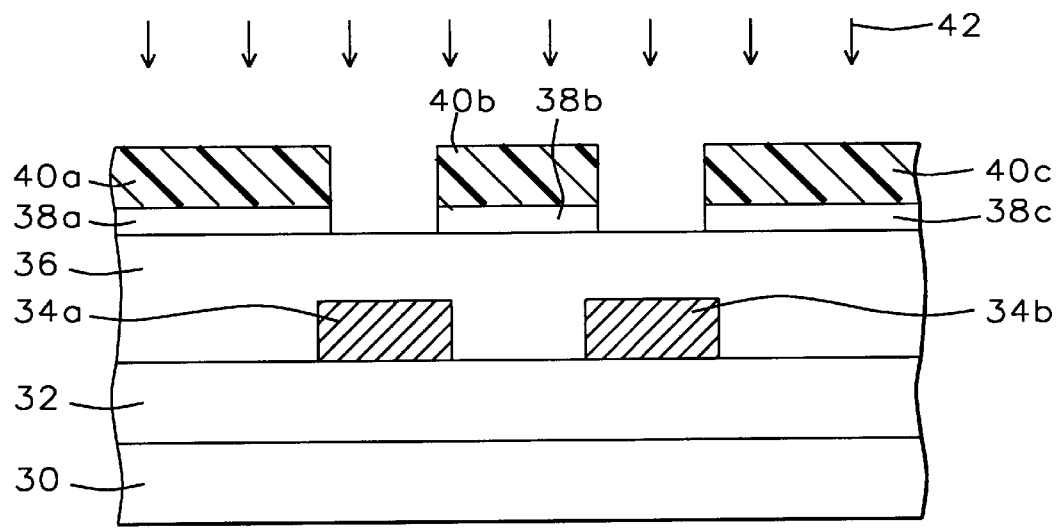

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the blanket hard mask layer 38 has been patterned to form the patterned hard mask layers 38a, 38b and 38c through etching with a first etching plasma 42 while employing the patterned photoresist layers 40a, 40b and 40c as a series of photoresist etch mask layers.

Within the second preferred embodiment of the present invention, where the blanket hard mask layer 38 is preferably formed of a titanium nitride material, the first etching plasma 42 is employed within a first plasma etch method which preferably employs an etchant gas composition which upon plasma activation yields an etch rate ratio of the blanket hard mask layer 38 with respect to the blanket inter-metal dielectric (IMD) layer 36 of at least about 30:1. It has been found experimentally that such an etch rate ratio may be maintained while employing a hexafluoroethane and argon containing etchant gas composition. Preferably, the first plasma etch method also employs: (1) a reactor chamber pressure of from about 2 to about 10 mtorr; (2) a radio frequency source power of from about 1000 to about 2000 watts at a radio frequency of 13.56 MHZ; (3) a bias power of from about 1000 to about 2000 watts; (4) a hexafluoroethane flow rate of from about 15 to about 30 standard cubic centimeters per minute (sccm); and (5) an argon flow rate of from about 100 to about 300 standard cubic centimeters per minute (sccm), for a time period sufficient to completely etch through the blanket hard mask layer 38 when forming the patterned hard mask layers 38*a*, 38*b* and 38*c*. Within the second preferred embodiment of the present invention, the oxygen containing plasma etchable material from which is formed the blanket inter-metal dielectric (IMD) layer 36 is not appreciable etched by the first etching plasma 42, due to the etch rate ratio of the blanket hard mask layer 36 with respect to the blanket inter-metal dielectric (IMD) layer 36 of at least about 30:1.

Figure 7:
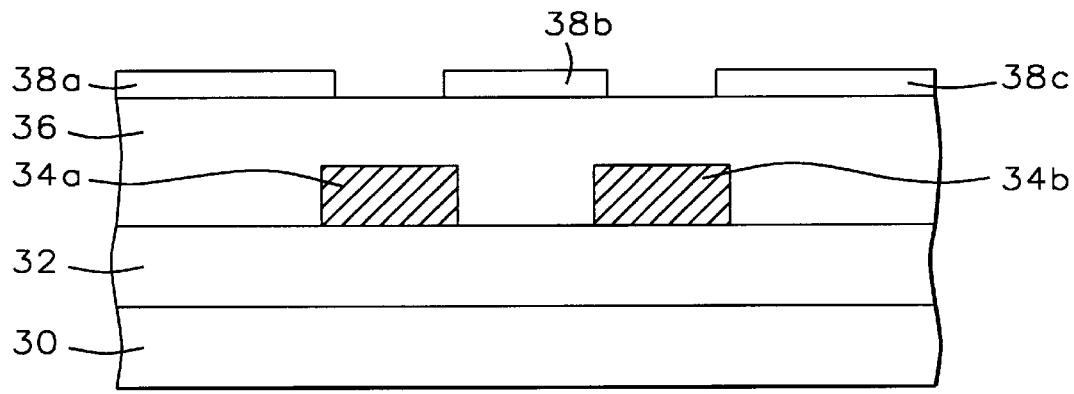

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the series of patterned photoresist layers 40*a*, 40*b* and 40*c* has been stripped from the corresponding series of patterned hard mask layers 38*a*, 38*b* and 38*c*. Within the second preferred embodiment of the present invention the series of patterned photoresist layers 40*a*, 40*b* and 40*c* may be stripped from the corresponding series of patterned hard mask layers 38*a*, 38*b* and 38*c* employing methods and materials analogous or equivalent to the methods and materials employing in stripping within the first preferred embodiment of the present invention the patterned photoresist layers 16*a* and 16*b* as illustrated within the schematic cross-sectional diagram of FIG. 2 to provide microelectronics fabrication whose schematic cross-sectional diagram is illustrated in FIG. 3.

Figure 8:
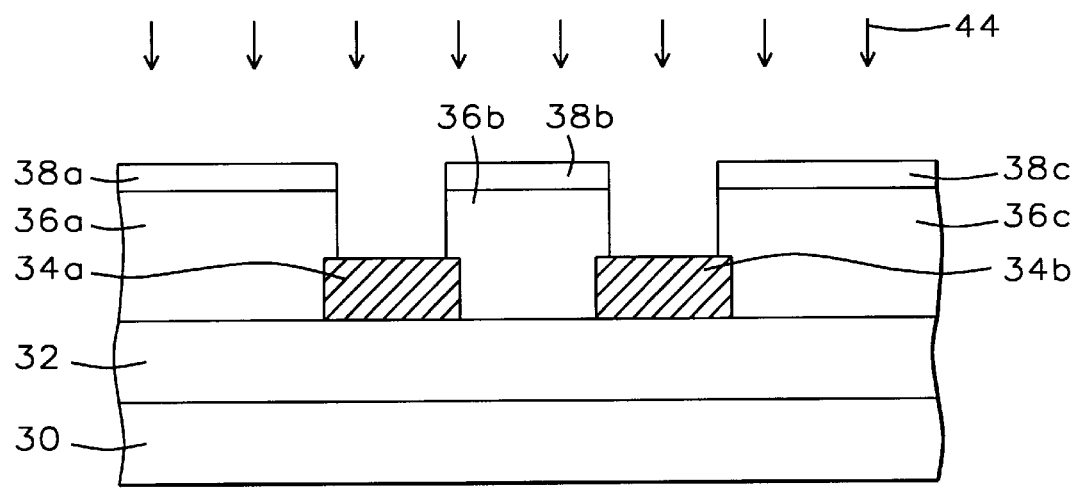

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein there has been patterned the blanket inter-metal dielectric (IMD) layer 36 to form the patterned inter-metal dielectric (IMD) layers 36*a*, 36*b* and 36*c*, through etching with a second etching plasma 44 while employing the series of patterned hard mask layers 38*a*, 38*b* and 38*c* as a second etch mask layer. Within the second preferred embodiment of the present invention, the second etching plasma 44 is preferably formed employing methods and materials analogous or equivalent to the methods and materials employed in forming the second etching plasma 20 within the first preferred embodiment of the present invention, as illustrated within the schematic cross-sectional diagram of FIG. 4.

More preferably, within the second preferred embodiment of the present invention the second etching plasma 44 is employed within a fluorine containing plasma etch method which employs a hexafluoroethane, octafluorocyclobutane and argon containing etchant gas composition. Preferably, the fluorine containing plasma etch method also employs: (1) a reactor chamber pressure of from about 2 to about 10 mtorr; (2) a source radio frequency power of from about 1000 to about 2000 watts at a source radio frequency of 13.56 MHZ; (3) a bias power of from about 1000 to about 2000 watts; (4) a hexafluoroethane flow rate of from about 10 to about 30 standard cubic centimeters per minute (sccm); (6) an octafluorocyclobutane flow rate of from about 5 to about 15 standard cubic centimeters per minute (sccm); and (6) an argon flow rate of from about 100 to about 200 standard cubic centimeters per minute (sccm), for a time period sufficient to reach the patterned conductor layers 34*a* and 34*b*, while simultaneously forming the patterned inter-metal dielectric (IMD) layers 36*a*, 36*b* and 36*c*.

When employing within the second preferred embodiment of the present invention the preferred materials as disclosed above for the patterned photoresist layers 40*a*, 40*b* and 40*c*, the blanket hard mask layer 38 and the blanket inter-metal dielectric (IMD) layer 36, along with the methods and materials as disclosed within the first etching plasma 42 and the second etching plasma 44, there is formed the microelectronics fabrication as illustrated within FIG. 6. The microelectronics fabrication has formed therein a pair of interconnection vias through an inter-metal dielectric (IMD) layer accessing a pair of patterned conductor layers, where the pair of interconnection vias is formed with attenuated lateral etching of the pair of interconnection vias when stripping from a series of patterned hard mask layers a series of patterned photoresist layers employed in defining the pair of vias through the inter-metal dielectric (IMD) layer.

As is understood by a person skilled in the art, the preferred embodiments of the present invention are illustrative of the present invention rather than limiting of the present invention. Revisions and modifications may be made to methods, materials, structures and dimensions through which are fabricated microelectronics fabrications in accord with the preferred embodiments of the present invention while still providing microelectronics fabrications which are fabricated in accord with the spirit and scope of the present invention, as defined by the appended claims.

What is claimed is:

1. A method for forming a patterned layer within a microelectronics fabrication comprising:

providing a substrate employed within a microelectronics fabrication;

forming over the substrate an oxygen containing plasma etchable layer, the oxygen containing plasma etchable layer being formed of a material which is also susceptible to etching within a fluorine containing plasma;

forming upon the oxygen containing plasma etchable layer a hard mask layer;

forming upon the hard mask layer a patterned photoresist layer;

etching through use of a first anisotropic plasma etch method the hard mask layer to form a patterned hard mask layer while simultaneously reaching the oxygen containing plasma etchable layer and while employing the patterned photoresist layer as a first etch mask layer, the first anisotropic plasma etch method employing an etchant gas composition appropriate for etching the hard mask material;

stripping from the patterned hard mask layer the patterned photoresist layer, the patterned photoresist layer being stripped employing a stripping method which does not attack the oxygen containing plasma etchable layer;

etching through use of a second plasma etch method the oxygen containing plasma etchable layer to form a patterned oxygen containing plasma etchable layer while employing the patterned hard mask layer as a second etch mask layer, the second plasma etch method being the fluorine containing plasma etch method.

2. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

3. The method of claim 1 wherein the oxygen containing plasma etchable layer is formed from an oxygen containing plasma etchable material selected from the group consisting of oxygen containing plasma etchable conductor materials, oxygen containing plasma etchable semiconductor materials and oxygen containing plasma etchable dielectric materials.

4. The method of claim 1 wherein the hard mask layer is formed from a hard mask material selected from the group consisting of metals, metal alloys, metal oxides, metal nitrides and composites thereof.

5. The method of claim 1 wherein the stripping method is a wet chemical stripping method.

6. The method of claim 1 wherein the fluorine containing plasma etch method employs a fluorine containing etchant gas selected from the group consisting of perfluorocarbons and hydrofluorocarbons.

7. The method of claim 6 wherein the fluorine containing plasma etch method also employs a sputtering gas component.

8. A microelectronics fabrication having formed therein a patterned oxygen containing plasma etched layer in accord with the method of claim 1.

9. A method for forming a patterned dielectric layer within a microelectronics fabrication comprising:

providing a substrate employed within a microelectronics fabrication;

forming over the substrate an oxygen containing plasma etchable dielectric layer, the oxygen containing plasma etchable dielectric layer being formed of a material which is also susceptible to etching within a fluorine containing plasma;

forming upon the oxygen containing plasma etchable dielectric layer a hard mask layer;

forming upon the hard mask layer a patterned photoresist layer;

etching through use of a first anisotropic plasma etch method the hard mask layer to form a patterned hard mask layer while simultaneously reaching the oxygen containing plasma etchable layer and while employing the patterned photoresist layer as a first etch mask layer, the first anisotropic plasma etch method employing an etchant gas composition appropriate for etching the hard mask material;

stripping from the patterned hard mask layer the patterned photoresist layer, the patterned photoresist layer being stripped employing a stripping method which does not attack the oxygen containing plasma etchable layer;

etching through use of a second plasma etch method the oxygen containing plasma etchable dielectric layer to form a patterned oxygen containing plasma etched patterned dielectric layer while employing the patterned hard mask layer as a second etch mask layer, the second plasma etch method being the fluorine containing plasma etch method.

10. The method of claim 9 wherein the microelectronics fabrication is selected from the group consisting of integrated circuit microelectronics fabrications, solar cell microelectronics fabrications, ceramic substrate microelectronics fabrications and flat panel display microelectronics fabrications.

11. The method of claim 9 wherein the oxygen containing plasma etchable dielectric layer is formed from an oxygen containing plasma etchable dielectric material selected from the group consisting of organic polymer spin-on-polymer dielectric materials, amorphous carbon materials and silsesquioxane spin-on-glass (SOG) dielectric materials.

12. The method of claim 9 wherein the hard mask layer is formed from a hard mask material selected from the group consisting of metals, metal alloys, metal oxides, metal nitrides and composites thereof.

13. The method of claim 9 wherein the stripping method is a wet chemical stripping method.

14. The method of claim 9 wherein the fluorine containing plasma etch method employs a fluorine containing etchant gas selected from the group consisting of perfluorocarbons and hydrofluorocarbons.

15. The method of claim 14 wherein the fluorine containing plasma etch method also employs a sputtering gas component.

16. A microelectronics fabrication having formed therein a patterned oxygen containing plasma etched dielectric layer in accord with the method of claim 9.

* * * * *